United States Patent [19]
Guard

[11] Patent Number: 5,463,342
[45] Date of Patent: Oct. 31, 1995

[54] METHOD AND APPARATUS FOR ENHANCING SIGNAL-TO-NOISE RATIO AND IMPROVING SENSITIVITY AND SIGNAL DETECTOR EMPLOYING SAME

[75] Inventor: Glenn B. Guard, Laurel, Md.

[73] Assignee: Westinghouse Electric Corp., Pittsburgh, Pa.

[21] Appl. No.: 125,266

[22] Filed: Sep. 30, 1993

[51] Int. Cl.$^6$ .......................... H03H 11/26; H03B 21/00
[52] U.S. Cl. ........................................... 327/269; 327/105
[58] Field of Search ...................... 307/529, 602, 307/261, 268; 328/60, 103, 104, 105, 165; 327/2, 3, 269, 105

[56] References Cited

U.S. PATENT DOCUMENTS

| | | | |
|---|---|---|---|
| 4,129,832 | 12/1978 | Neal | 331/44 |
| 4,363,139 | 12/1982 | Sullivan | 455/324 |
| 4,364,048 | 12/1982 | Waters et al. | 343/5 EM |
| 4,653,869 | 3/1987 | Gottlieb et al. | 350/372 |
| 4,709,212 | 11/1987 | MacFall et al. | 324/309 |
| 4,780,667 | 10/1988 | Reese | 324/83 FE |
| 4,812,849 | 3/1989 | Otto | 342/194 |
| 5,008,571 | 4/1991 | Rudish | 307/529 |
| 5,038,784 | 8/1991 | Dumoulin | 128/653 AF |
| 5,220,683 | 6/1993 | Rudish | 455/146 |

*Primary Examiner*—Steven Mottola
*Assistant Examiner*—Trep H. Nguyen
*Attorney, Agent, or Firm*—C. O. Edwards

[57] ABSTRACT

An apparatus and method for enhancing the signal-to-noise ratio of an input signal which divides the input signal into a plurality of divided signals of equal power, introduces a delay into a corresponding one of the plurality of divided signals, mixes together pairs of the plurality of delayed divided signals, and sums the mixed signals. The apparatus and method of the present invention may be employed in a signal detector to improve the sensitivity of the signal detector.

8 Claims, 9 Drawing Sheets

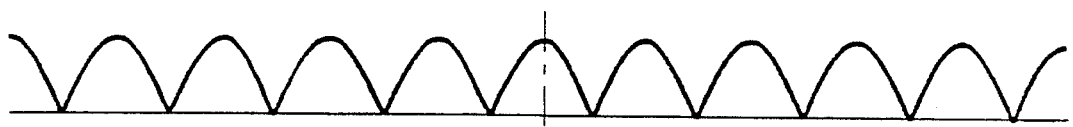
FIG.2F
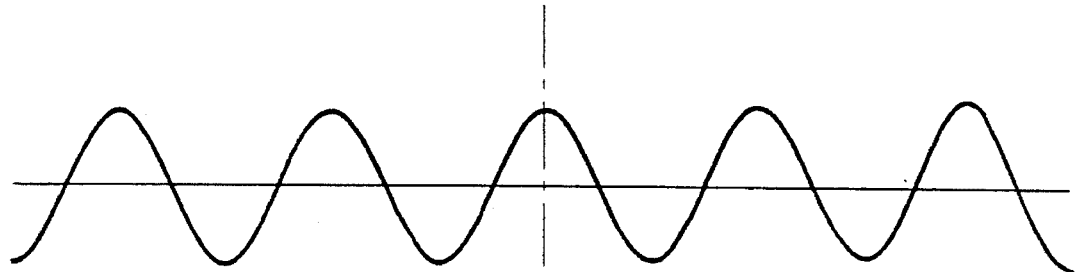
FIG.2E
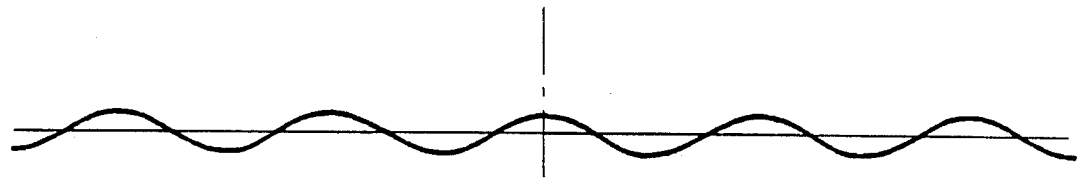
FIG.2D
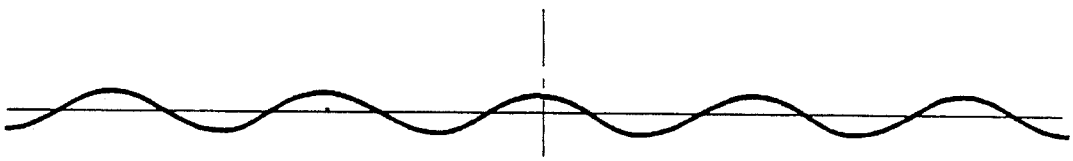
FIG.2C
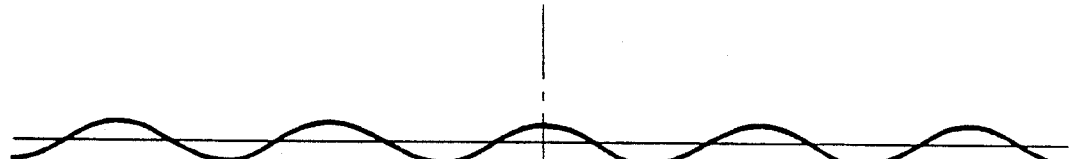
FIG.2B
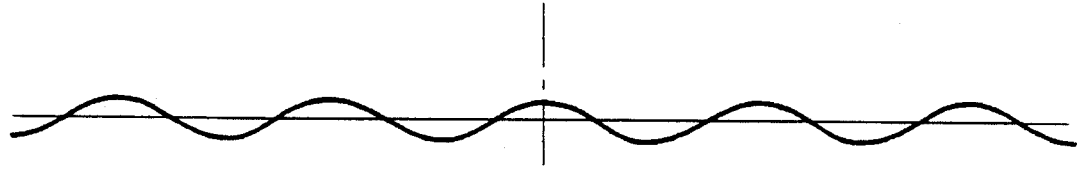
FIG.2A   $f_0$
FREQUENCY $f_0$

FREQUENCY

TIME

TIME

METHOD AND APPARATUS FOR ENHANCING SIGNAL-TO-NOISE RATIO AND IMPROVING SENSITIVITY AND SIGNAL DETECTOR EMPLOYING SAME

BACKGROUND OF THE INVENTION

1. Field of the Invention

The present invention relates to a method and apparatus for detecting and processing signals. More particularly, the present invention relates to a signal detector having improved sensitivity and output signal-to-noise ratio.

2. Discussion of the Related Art

FIG. 13 shows an example of a square law detector. Square law detectors typically include a band pass filter 100, processing circuit 200, and a low pass filter 300. In simplified form, processing circuit 200 may include a power divider 210 and a mixer 220.

In a general sense, square law detectors are used to detect the presence of a received signal. Thresholding circuitry, which is typically connected to the output of the square law detector, is then used to detect a change in state, such as a pulse, in the signal received from the square law detector. The ability of a detector to provide a signal to the thresholding circuitry which the thresholding circuitry can distinguish one state from another, is limited by the detector's ability to detect the presence of the signal when ambient noise is also present. Moreover, it is only in rare circumstances that ambient noise is not present. Thus, performance of a detector is typically described in terms of its sensitivity, i.e., its ability to detect the presence of a signal when the level of the received noise is relatively high with respect to the level of the received signal. A measure of the relative levels of a signal and the ambient noise is expressed as a signal-to-noise ratio (SNR). The higher the SNR of a received signal, the more likely a detector will be able to detect the presence of a signal which the threshold circuitry can detect a change in the signal's state. For each detector there exists a minimum SNR of a received signal at which detector can effectively detect the presence of a signal. Hence, the greater a detector's sensitivity, the lower the SNR which the received signal is required to have in order for the thresholding circuitry to accurately detect a change in state.

Although ambient noise may exist at all frequencies, a square law detector can be used to increase the output SNR of a received signal by selecting bandwidths for the band pass and low pass filters which allow the received signal to be passed therethrough, but which prevent some of the noise from passing through. However, the filters cannot prevent the noise which is present within the frequency bandwidth of the received signal from passing through. Therefore, square law detectors are limited in their capability for enhancing the SNR of a received input signal—particularly, in an Electronic Countermeasures (ECM) application in which the bandwidth of the filters must be large in order to allow detection of a large number of possible signals. If the SNR of the received input signal is insufficient, a square law detector will not provide the output SNR that is required for the threshold circuitry to detect a change in the signal state. Thus, the sensitivity of a square law detector is also limited in this respect.

SUMMARY OF THE INVENTION

Accordingly, the present invention has been made in view of the above circumstances and has as an object to provide a signal detecting circuit having improved sensitivity.

A further object of the present invention is to enhance the output SNR of a detector.

Additional objects and advantages of the invention will be set forth in part in the description which follows and in part will be apparent from the description, or may be learned by practice of the invention. The objects and advantages of the invention may be realized and attained by means of the instrumentalities and combinations particularly pointed out in the written description and claims hereof as well as the appended drawings.

To achieve these and other objects and advantages and in accordance with the purpose of the invention, as embodied and broadly described herein, the apparatus of this invention comprises power dividing means for dividing an input signal into a pair of divided signals of equal power, delay means, connected to the power dividing means, for introducing a delay into one of the divided signals, and mixing means, connected to the delay means and the power dividing means, for mixing together the divided signal having a delay introduced therein by the delay means and the other divided signal.

Additionally, further enhancement of the SNR of an input signal may be achieved by providing an apparatus which comprises power dividing means for dividing an input signal into a plurality of divided signals of equal power, a plurality of delay means, connected to the power dividing means, each for introducing a delay into a corresponding one of the plurality of divided signals, a plurality of mixing means, each associated with and connected to a pair of the plurality of delay means, for mixing together pairs of the plurality of divided signals delayed by the delay means, and voltage summing means for receiving and summing outputs of the plurality of mixing means.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification illustrate several embodiments of the invention and, together with the description, serve to explain the objects, advantages, and principles of the invention. In the drawings.

FIG. 2(A) is an exemplary representation of the output signal from mixer 40 of FIG. 1(B).

FIG. 2(B) is an exemplary representation of the output signal from mixer 41 of FIG. 1(B).

FIG. 2(C) is an exemplary representation of the output signal from mixer 42 of FIG. 1(B).

FIG. 2(D) is an exemplary representation of the output signal from mixer 43 of FIG. 1(B).

FIG. 2(E) represents the output of summing network 50 with input traces of FIGS. 2(A)–2(D).

FIG. 2(F) represents a rectified version of the signal of FIG. 2(E).

FIG. 5 is an exemplary signal diagram of an output signal of the signal detector shown in FIG. 1(A) employing the four channel signal processing circuit shown in. FIG. 1(B);

DETAILED DESCRIPTION OF THE PREFERRED EMBODIMENTS

Reference will now be made in detail to the present preferred embodiments of the invention, examples of which are illustrated in the accompanying drawings.

Figure 1A:
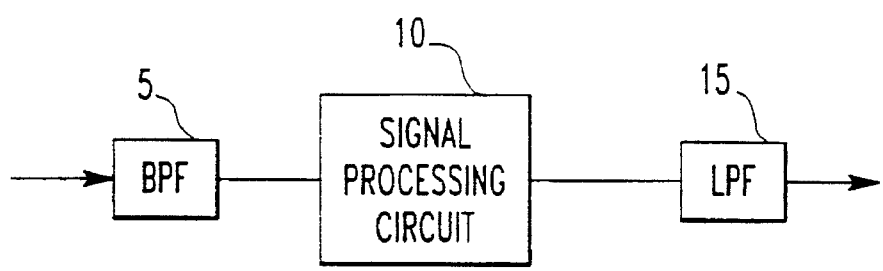
FIG. 1(A) is a block diagram of a signal detector constructed in accordance with the present invention.

The present invention is directed to a signal detector which exhibits enhanced output SNR and improved sensitivity. The signal detector of the present invention is shown in FIG. 1(A) and, in general, includes a band pass filter 5, a signal processing circuit 10, and a low pass filter 15. The improvement in sensitivity and output SNR which the present invention provides, primarily results from the use of a specific signal processing circuit 10 which will be described in detail below. However, it will be apparent to the ordinarily skilled artisan that, when the signal processing circuit 10 of the present invention is included in a signal detector utilized for various applications, different design constraints result which may affect the selection of bandwidths for band pass filter 5 and low pass filter 15. Thus, although the filter characteristics of the filters of the present invention and the conventional square law detector are chosen to be identical in the comparative examples provided below, it may be desirable to chose different filter characteristics from those which may typically be used in a conventional square law detector to obtain additional advantages.

Figure 1B:
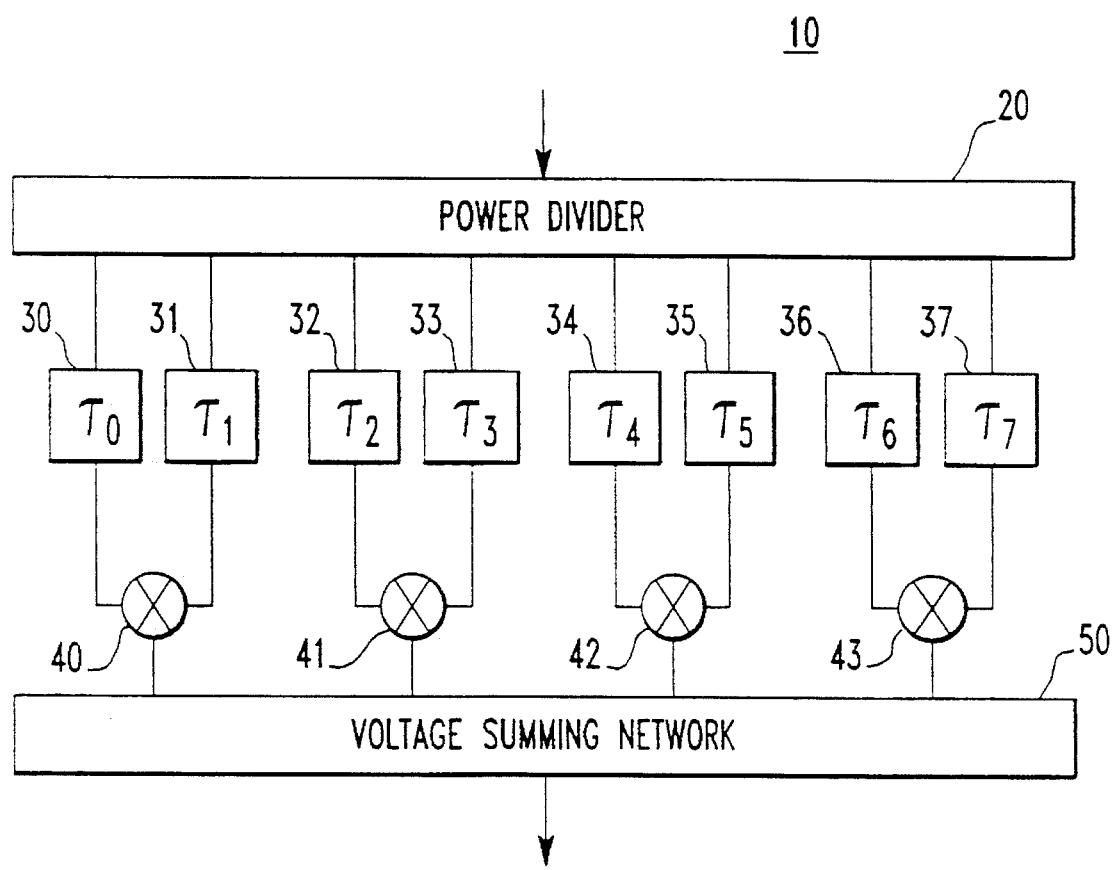
FIG. 1(B) is a block diagram of a four channel signal processing circuit constructed in accordance with the present invention.
Figure 3F:
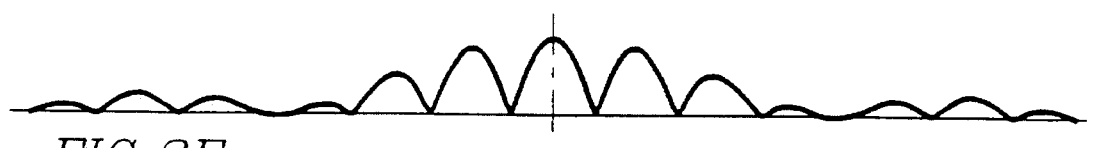
FIG. 3(F) represents a rectified version of the signal of FIG. 3(F).
Figure 3E:
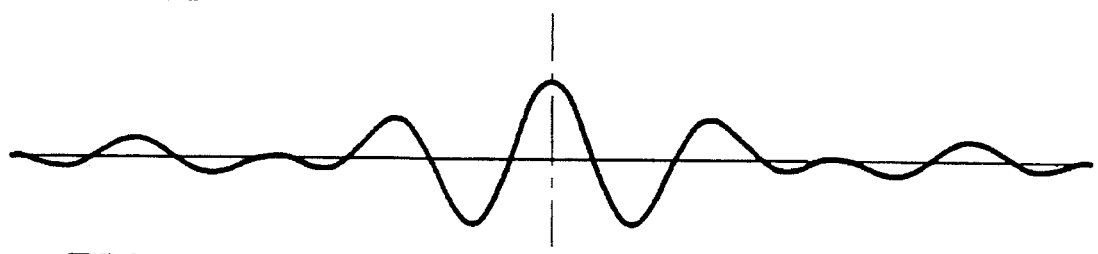
FIG. 3(E) represents the output of summing network 50 with input traces of FIGS. 3(A)–3(D).
Figure 3D:
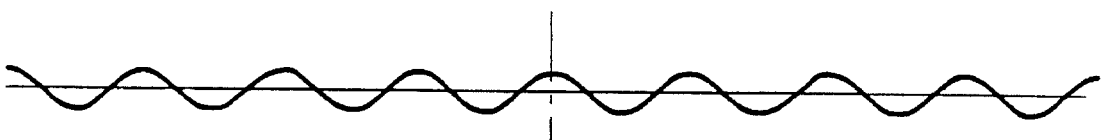
FIG. 3(D) is another exemplary representation of the output signal from mixer 43 of FIG. 1(B).
Figure 3C:
FIG. 3(C) is another exemplary representation of the output signal from mixer 42 of FIG. 1(B).
Figure 3B:
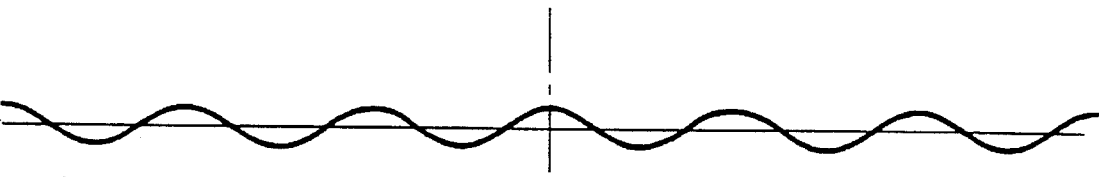
FIG. 3(B) is another exemplary representation of the output signal from mixer 41 of FIG. 1(B).
Figure 3A:
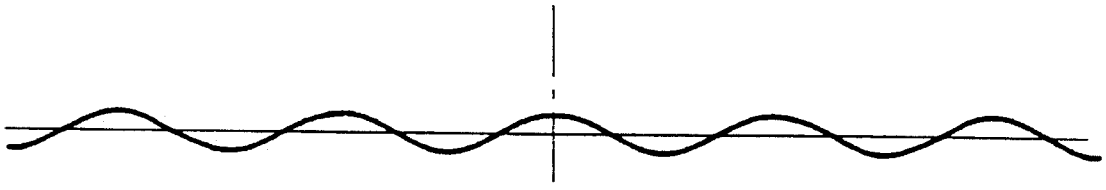
FIG. 3(A) is another exemplary representation of the output signal from mixer 40 of FIG. 1(B).

A four channel signal processing circuit of the present invention is shown in FIG. 1(B) and is designated generally by the reference numeral 10. Signal processing circuit 10 includes, but is not specifically limited to, a power divider 20, a plurality of delay circuits 30–37 connected to power divider 20, a plurality of mixers 40–43 each associated with and connected to a pair of the delay circuits 30–37, and a voltage summing network 50 for receiving and summing the outputs of the plurality of mixers 40–43.

The details of the above described invention are hereinafter described. Power divider 20 receives an input signal, which may, for example, be received from band pass filter 5. Power divider 20 divides the received input signal into a plurality of divided signals having equal power.

The delay circuits 30–37 are connected to power divider 20 and each receive a corresponding one of the divided signals supplied from power divider 20. Each delay circuit 30–37 introduces a delay into the corresponding one of the divided signals. The delays introduced by the delay circuits 30–37 are identified as $\tau_0$, $\tau_1$, $\tau_2$, $\tau_3$, $\tau_4$, $\tau_5$, $\tau_6$, and $\tau_7$, respectively. The delay circuits are grouped in pairs which will hereinafter be described as a channel. Hence, the signal processing circuit, as shown in FIG. 1(B), constitutes a four channel signal processing circuit.

The pair of delay circuits (30 and 31, 32 and 33, 34 and 35, and 36 and 37) of each channel is connected to a mixer (40–43) which mixes the delayed signals provided by the associated pair of delay circuits. Mixers 40–43 supply the mixed signals to the voltage summing network 50 which sums the mixed signals. The output of the signal processing circuit (i.e., the output from voltage summing network 50) may be supplied to a low pass filter which prevents undesirable frequency components from passing therethrough and to provide a video output signal having a SNR that is improved over that of a square law detector.

The frequency response of the signal detector of the present invention is a function of the specific delays selected. An example of the frequency response of signal detector employing a four channel signal processing circuit such as that shown in FIG. 1(B), is shown in FIG. 2. In this example, the delays are selected such that the following relationships exist:

$$\Delta\tau = \tau_1 - \tau_0 = \tau_3 - \tau_2 = \tau_5 - \tau_4 = \tau_7 - \tau_6 \qquad (1)$$

$$\tau_2 = \tau_1,\ \tau_4 = \tau_3,\ \text{and}\ \tau_6 = \tau_5 \qquad (2)$$

In order to have noise voltages which are relatively independent statistically among the channels, $\Delta\tau$ should be selected to be at least as long as the reciprocal of the IF bandwidth.

Traces A, B, C, and D shown in FIG. 2, represent the relative voltage outputs of mixers 40, 41, 42, and 43, respectively, as a function of frequency. These voltage outputs are input into voltage summing network 50. The output of voltage summing network 50 when Traces A–D are input therein, is shown as Trace E in FIG. 2. Trace F is a rectified version of Trace E and represents the magnitude of the frequency response of a signal detector employing the four channel signal processing circuit having the exemplified delays illustrated in FIG. 2. If $\Delta \tau$ is selected to be equal to the reciprocal of the IF bandwidth, it should be apparent from the example shown in FIG. 2, that the relative voltage peaks of Trace F are spaced $1/(2\Delta \tau)$ apart in frequency and the relative voltage peaks of Traces A–E are spaced $1/\Delta \tau$ apart.

FIG. 3 shows another example of the frequency response of a signal detector employing the four channel signal processing circuit of the present invention in which an alternate set of delays is utilized which do not satisfy equation (1) but instead satisfy the following relationships:

$$\Delta \tau_1 = \tau_1 - \tau_0 \quad (3)$$

$$\Delta \tau_2 = \tau_3 - \tau_2 \quad (4)$$

$$\Delta \tau_3 = \tau_5 - \tau_4 \quad (5)$$

$$\Delta \tau_4 = \tau_7 - \tau_6 \quad (6)$$

$$\Delta \tau_1 = \Delta \tau_2 = \Delta \tau_3 = \Delta \tau_4 \quad (7)$$

In order to have noise voltages which are relatively independent statistically among the channels, equation (2) was satisfied and $\Delta \tau_1$, $\Delta \tau_2$, $\Delta \tau_3$, and $\Delta \tau_4$ were each selected to be at least as long as the reciprocal of the IF bandwidth. For purposes of comparison, if $\Delta \tau$ in equation (1) is set to 10 ns and $\tau_1$ is set to 0, then to alter the delays to produce the results shown in FIG. 3, $\Delta \tau_1$ would be set to 10 ns, $\Delta \tau_2=12$ ns, $\Delta \tau_3=14$ ns, $\Delta \tau_4=16$ ns, and $\tau_0=0$. Thus, by adjusting the relations between the delays within each channel, the frequency response may be shaped to cope with different signal environment densities.

Figure 4:
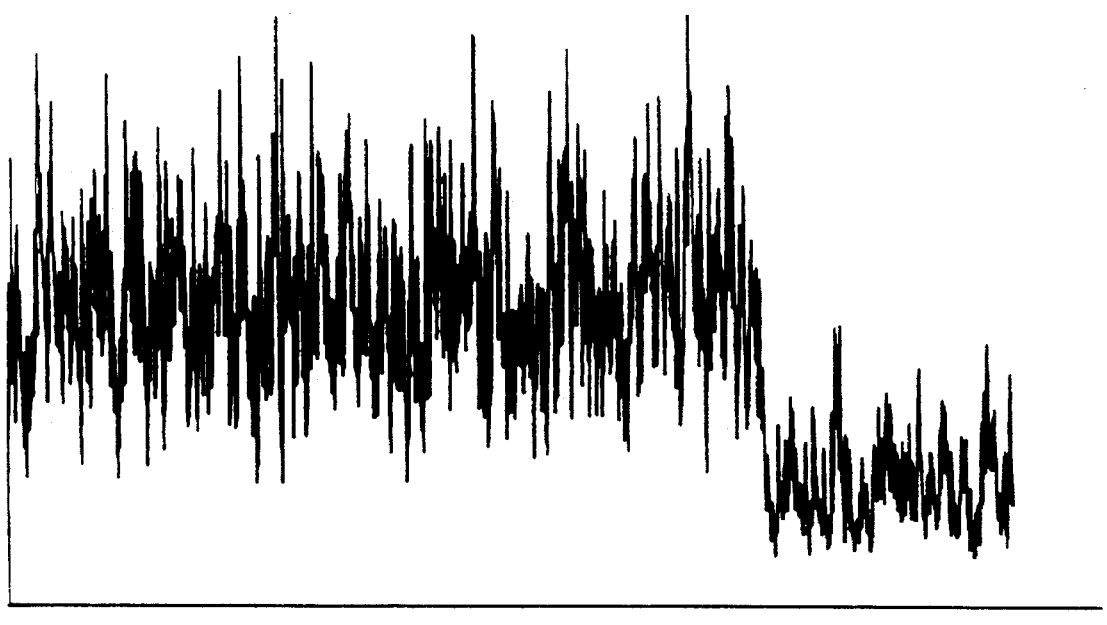
FIG. 4 is an exemplary signal diagram of an output signal of the square law detector shown in FIG. 13.
Figure 13:
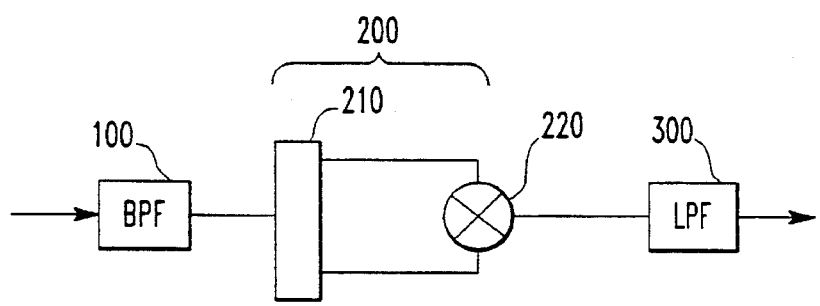
FIG. 13 is a block diagram of a conventional square law detector.

FIG. 4 shows an output signal taken from the conventional square law detector shown in FIG. 13 when an input signal of 750 MHz is input to band pass filter 100 having a bandwidth of 500 MHz, and when low pass filter 300 has a bandwidth of 20 MHz. The output signal shown in FIG. 4 has a SNR of 8.0 dB during the pulse.

Figure 5:
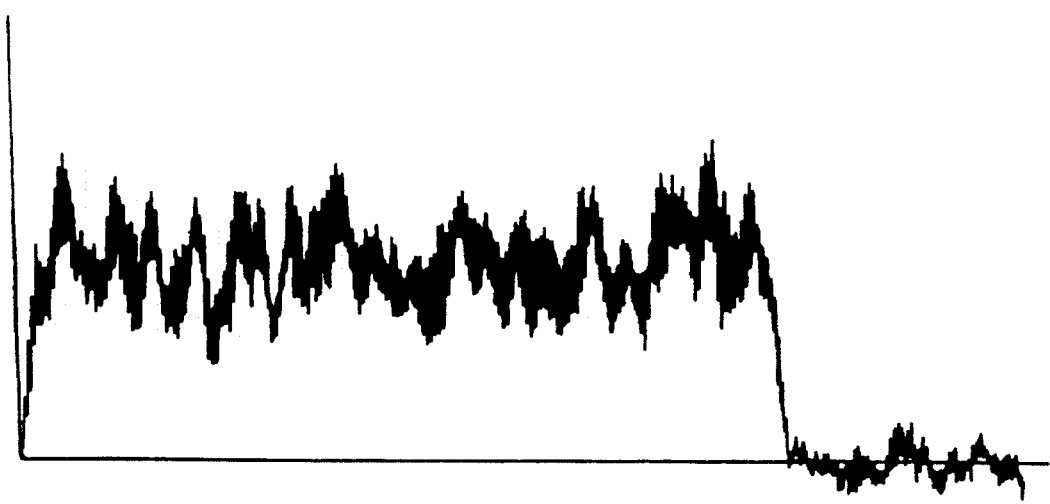

FIG. 5 shows an output signal taken from low pass filter 15 having a bandwidth of 20 MHz when the output from a four channel signal processing circuit of the present invention, is supplied thereto, when a received input signal of 750 MHz is first filtered by band pass filter 5 having a bandwidth of 500 MHz, and when $\tau$ is 20 ns and $\tau_0=0$. The output signal shown in FIG. 5 has a SNR of 14.8 dB during the pulse. Thus, an increase from 8.0 dB to 14.8 dB can be achieved by employing the signal processing circuit of the present invention.

In comparing FIGS. 4 and 5, it will be apparent that a threshold voltage could be selected for use in the present invention that would not result in a detection error, whereas no threshold voltage could be selected for the square law detector that would not result in at least one detection error.

If a square law detector provided an output having sufficient SNR for the purpose for which it is employed, one may increase the sensitivity of the square law detector by replacing the signal processing circuit 200 with the signal processing circuit 10 of the present invention. The signal processing circuit of the present invention increases the sensitivity of a receiver by decreasing the SNR of the input signal which is required to provide a given output SNR. Thus, the required minimum input SNR may be decreased by an amount approximately equal to one half the dB's by which the SNR of the present invention increases the SNR of the output signal. For example, in the comparative example discussed above with respect to FIGS. 4 and 5, an increase of 6.8 dB in the output SNR was obtained. If, however, an output SNR of 8.0 dB is sufficient to allow error-free detection, using the signal processing circuit of the present invention would provide the 8.0 dB output SNR when the input signal has an input SNR approximately 3.4 dB less than the input SNR required to provide the 8.0 dB output SNR in a square law detector.

An N channel signal processing circuit of the present invention will now be described where like or similar parts are identified throughout the drawings by the same reference characters.

Figure 6:
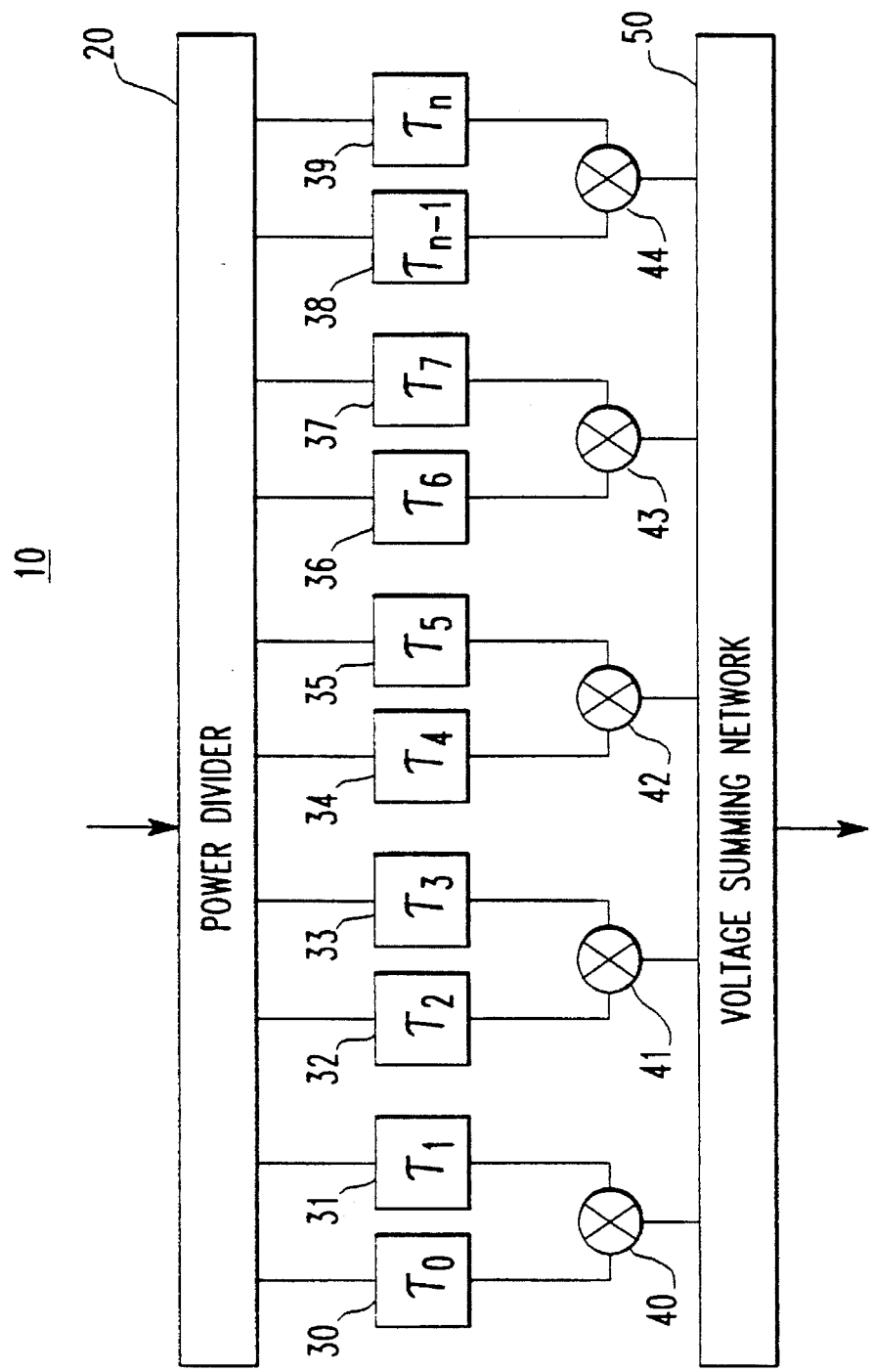
FIG. 6 is a block diagram of an N channel signal processing circuit constructed in accordance with the present invention.
Figure 7:
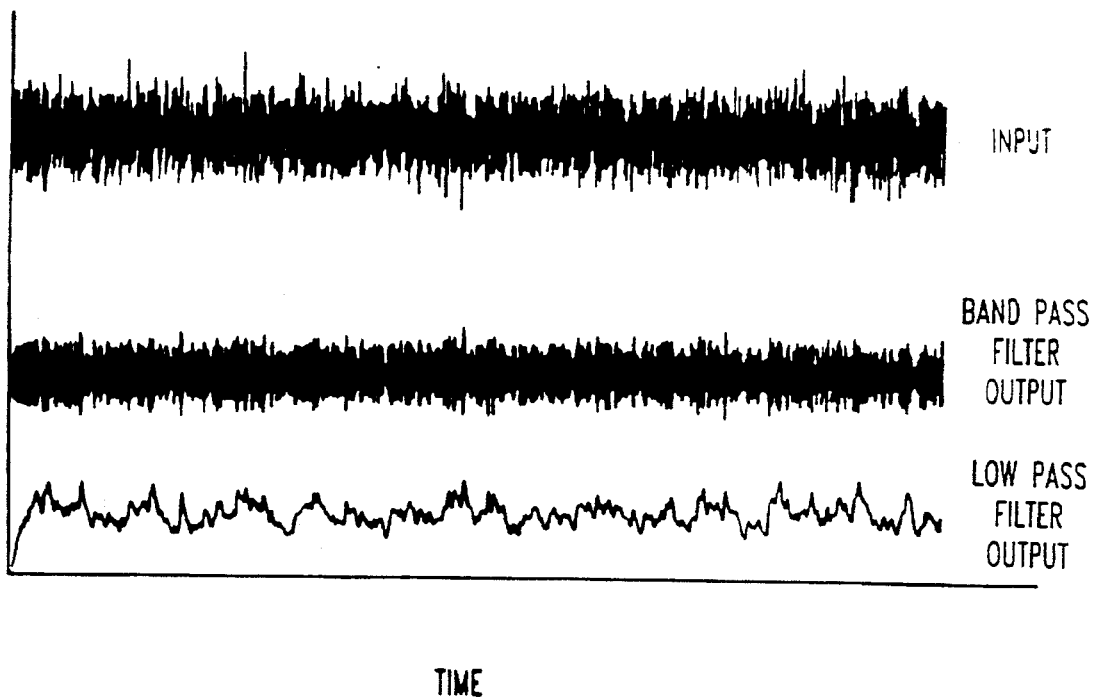
FIG. 7 is an exemplary signal diagram of output voltages representing an input signal, a band pass filter output signal, and a low pass filter output signal of the square law detector shown in FIG. 13.
Figure 8:
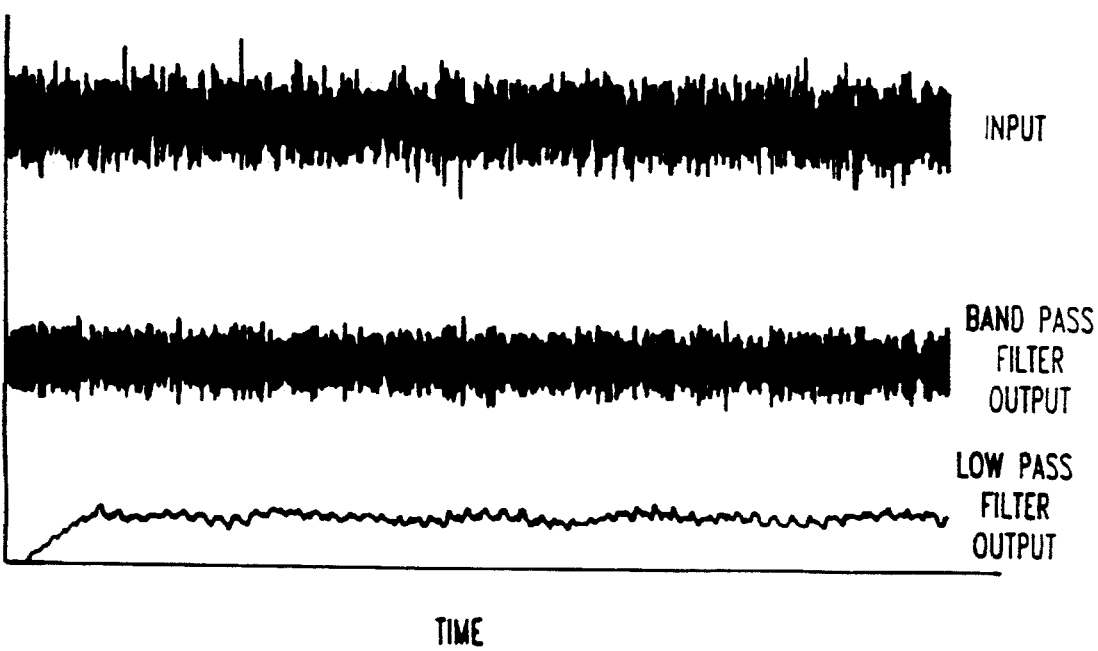
FIG. 8 is an exemplary signal diagram of output voltages representing an input signal, a band pass filter output signal, and a low pass filter output signal of a signal detector utilizing the four channel signal processing circuit shown in FIG. 1(B)
Figure 9:
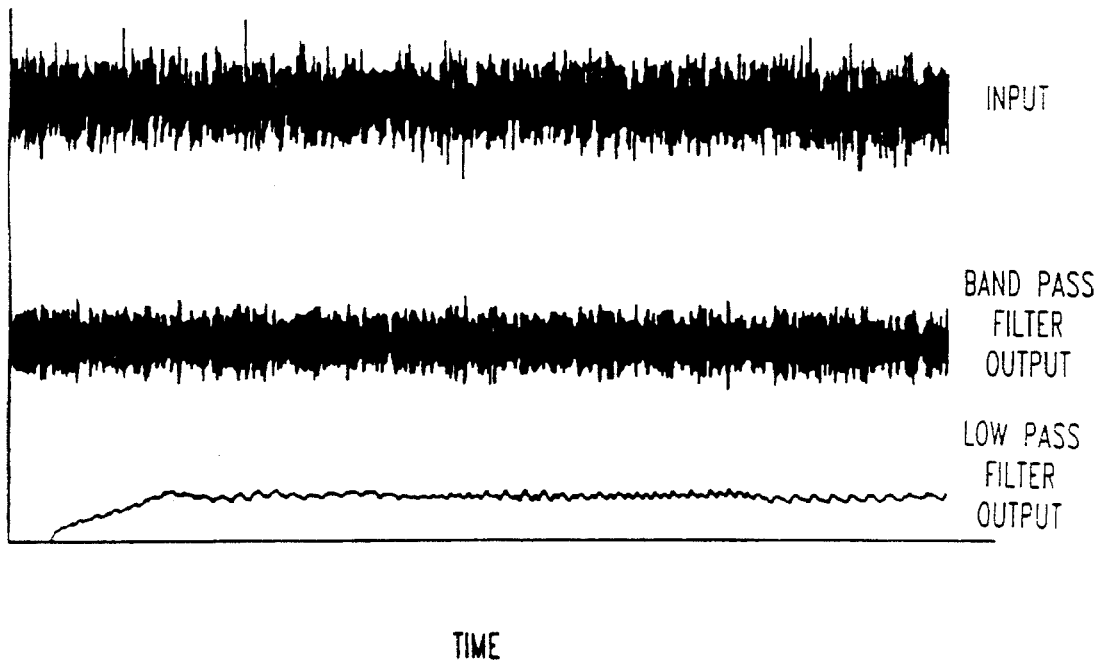
FIG. 9 is an exemplary signal diagram of output voltages representing an input signal, a band pass filter output signal, and a low pass filter output signal of a signal detector utilizing an eight channel signal processing circuit constructed in accordance with the present invention.
Figure 10:
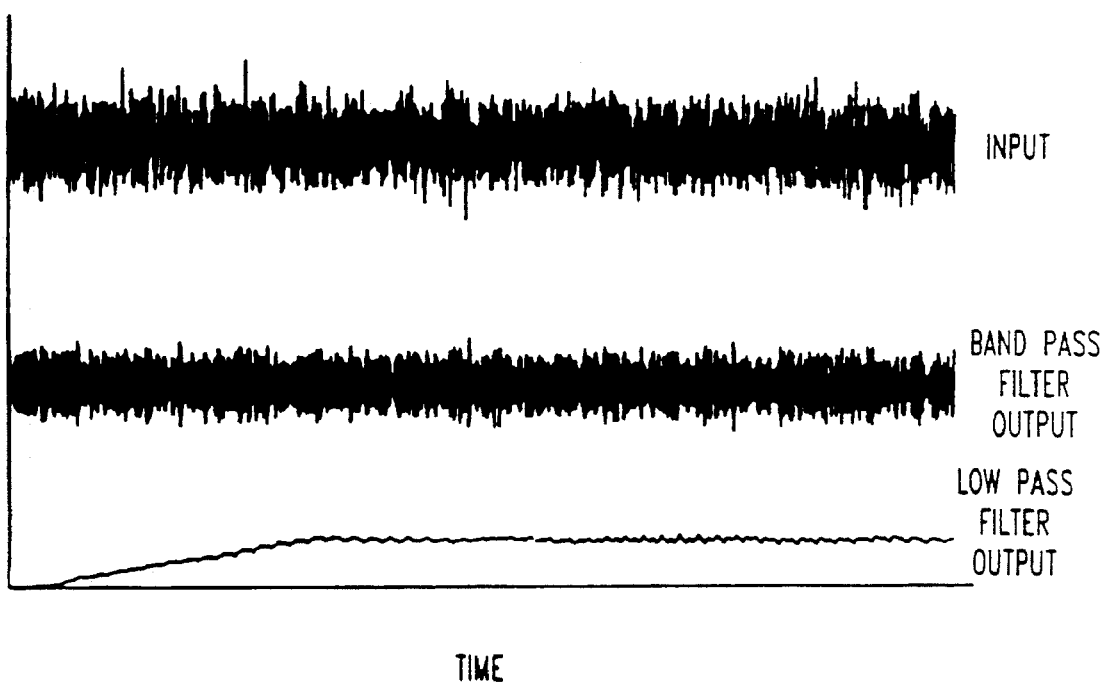
FIG. 10 is an exemplary signal diagram of output voltages representing an input signal, a band pass filter output signal, and a low pass filter output signal of a sixteen channel signal detector constructed in accordance with the present invention.

FIG. 6 shows an N channel signal processing circuit constructed in accordance with the present invention. The number of channels N may be selected to further increase the output SNR or to increase the sensitivity of a receiver including the N channel signal processing circuit. The effect of increasing the number of channels N of the signal processing circuit is illustrated in FIGS. 7–10. FIG. 7 shows a signal diagram of a 750 MHz input signal, an output signal from band pass filter 100, and an output signal from low pass filter 300 of the conventional square law detector, shown in FIG. 13. In the examples illustrated in FIGS. 7–10, the same band pass filter, which has a bandwidth of 500 MHz, was used. Therefore, the input signal and the band pass filter output signal are identical so that the output signals of the examples can be directly compared. Likewise, the same low pass filter, which has a 20 MHz bandwidth, was used in the illustrations of FIGS. 7–10. FIG. 8 shows a signal diagram of the input and band pass filter 5 output signals, and a low pass filter 15 output signal of a signal detector utilizing the four channel signal processing circuit of the present invention where $\tau=20$ ns and $\tau_0=0$. FIG. 9 is identical to FIG. 8 except that it illustrates a low pass filter 15 output signal of a signal detector utilizing an eight channel signal processing circuit. Similarly, FIG. 10 is identical to FIGS. 8 and 9 except that it illustrates a low pass filter 15 output signal of a signal detector utilizing a sixteen channel signal processing circuit.

A comparison of the low pass filter output signals of FIGS. 8–10 shows that the output SNR of the signal processing circuit of the present invention increases as the number of channels N increases. As the number of channels increases, the slope of the output signal decreases which may result in a delay in pulse detection. Thus, if a pulse width is too narrow, it may be possible that a signal processing circuit having a large number of channels will not detect the pulse. Therefore, the number of channels which one of ordinary skill should select will depend upon a number of criteria including cost restrictions, size requirements, and additionally the pulse width of the shortest pulse to be detected in the input signal.

Figure 11:
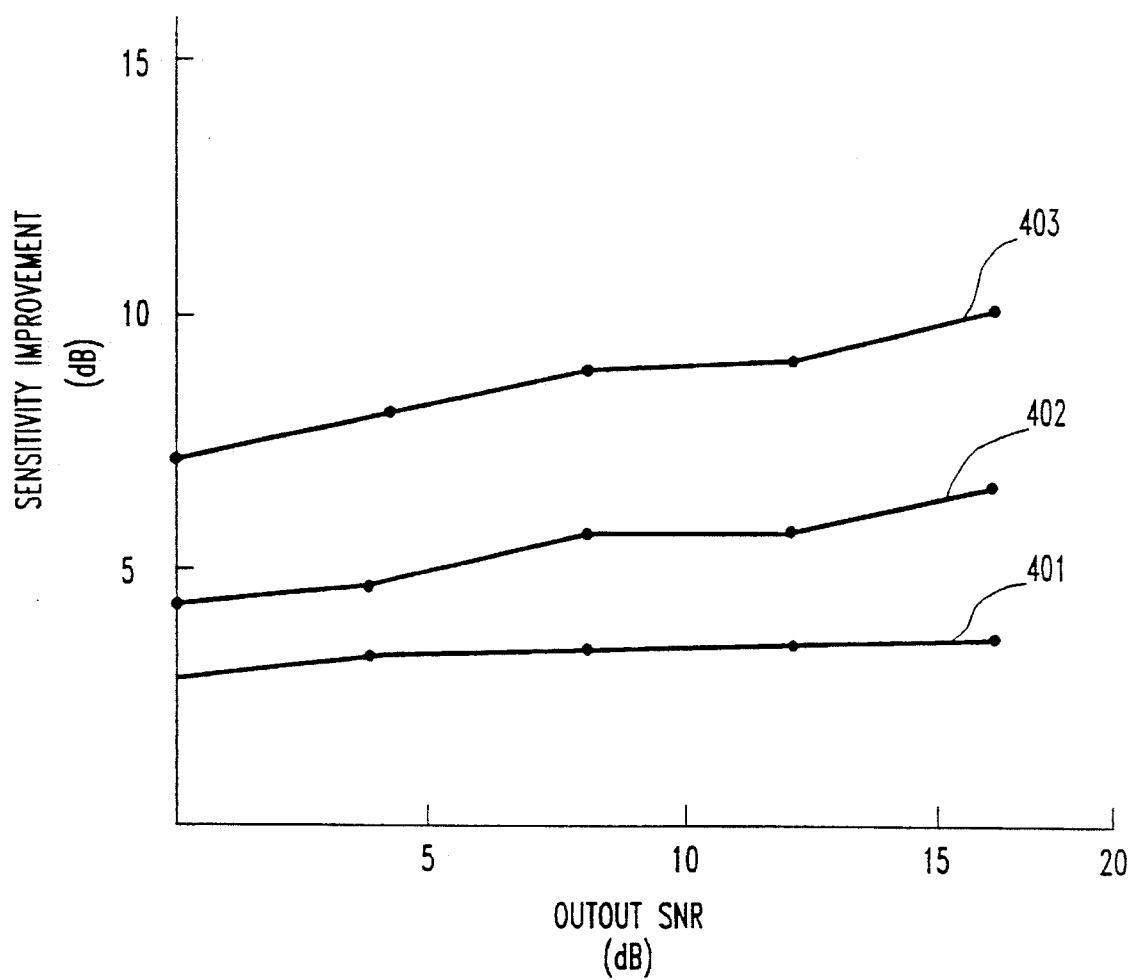
FIG. 11 is a graphic illustration of the improvements in sensitivity versus output SNR for three comparative examples.

FIG. 11 illustrates the sensitivity improvements for three comparative examples versus the output SNR. Line 401 represents the sensitivity improvement in dB for a 20/3 square law detector (i.e., a square law detector in which the IF or RF bandwidth of the band pass filter is 20 MHz and the video bandwidth of the low pass filter is 3 MHz) over a 20/10 square law detector. Line 402 represents the sensitivity improvement in dB for a 20/3 signal detector employing the six channel signal processing circuit of the present invention over a 20/3 square law detector. Line 403 represents the sensitivity improvement in dB for a 20/3 signal detector employing the six channel signal processing circuit of the present invention over a 20/10 square law detector.

Referring back to trace E in FIGS. 2 and 3, which represents the frequency response of the output signal, it will be apparent to those of ordinary skill in the art that there will be no output from the signal processing circuit at those frequencies at which trace E intersects the horizontal axis. Further, the output from the signal processing circuit will have reduced output at certain frequencies. Depending on the application in which the signal processing circuit of the present invention will be utilized this may not present a problem. If, however, the signal processing circuit of the present invention is to receive an output from a tuner which scans frequency regions of interest, such as a radar scanner, it may be necessary that the signal processing circuit output a signal at all frequencies. In this case, it is possible to employ a plurality of signal processing circuits each tuned in a staggered manner such that there are no frequencies at which the combined signal processing circuits will not provide an output.

Figure 12:
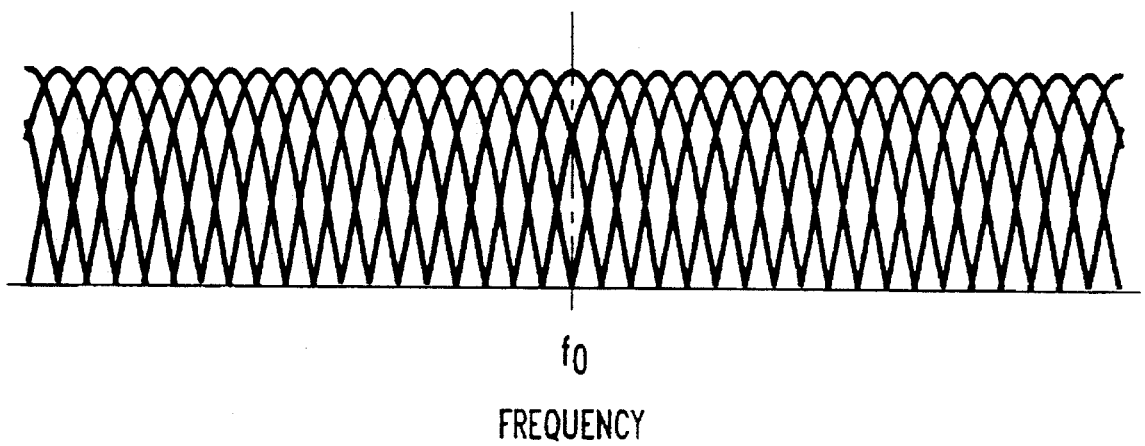
FIG. 12 is a signal diagram of the frequency response of a signal detector employing multiple stagger-tuned signal processing circuits which represent an example of an application of the signal detector of the present invention.

FIG. 12 shows the frequency response of a signal detector a plurality of employing stagger-tuned signal processing circuits. Although, use of a plurality of stagger-tuned signal processing circuits results in an output at all frequencies, the output is still slightly reduced at some frequencies. A solution to this problem is to utilize two stagger-tuned signal processing circuits in quadrature multiplexing, one tuned to provide an in-phase (I) channel and the other tuned to provide a quadrature (Q) channel. Thus, if the I channel produces an output having the frequency response shown as trace E in FIG. 2 and the Q channel produces an output having a frequency response similar to trace E in FIG. 2 only 90° out of phase therewith, summing the squares of the I and Q channel outputs will result in a constant output for all frequencies.

The signal processing circuit of the present invention has been described above as being utilized in a signal detector. Such a signal detector may be utilized in radar, communication, Electronic Support Measures (ESM), Electronic Countermeasures (ECM), and Electronic Intelligence (ELINT) systems. Further, the signal processing circuit of the present invention may be used to enhance the SNR of both pulsed and continuous wave (CW) radio frequency signals.

Although the embodiments described above include four or more channels, the present invention is not so limited. Depending on the application of the signal detector of the present invention, it may be desirable to use a one, two, or three channel signal processing circuit.

Additionally, by proper selection of the delay values, the frequency response of the signal detector of the present invention can be shaped to cope with various signal environment densities.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An apparatus comprising:

power dividing means for dividing an input signal into a plurality of divided signals of equal power;

a plurality of delay means, connected to said power dividing means, each for introducing a delay into a corresponding one of said plurality of divided signals; and a plurality of mixing means, each associated with and connected to a pair of said plurality of delay means and said power dividing means, for mixing together pairs of the plurality of divided signals having a delay introduced therein by said delay means, wherein the delay introduced by each pair said of said plurality of delay means is at least as great as the reciprocal of the information bandwidth of the input signal.

2. An apparatus comprising:

power dividing means for dividing an input signal into a plurality of divided signals of equal power;

a plurality of delay means, connected to said power dividing means, each for introducing a delay into a corresponding one of said plurality of divided signals;

a plurality of mixing means, each associated with and connected to a pair of said plurality of delay means, for mixing together pairs of the plurality of divided signals delayed by said delay means; and voltage summing means for receiving and summing outputs of said plurality of mixing means.

3. The apparatus of claim 2, wherein each of said mixing means and the pair of delay means associated and connected thereto form one of a plurality of channels, each pair of delay means includes a first delay circuit and a second delay circuit, the first delay circuit of a first channel introduces no delay into the corresponding divided signal received thereby, and wherein the first delay circuits of the remaining channels introduce a delay into the corresponding divided signals which is equal to a delay introduced by the second delay circuit of a preceding channel.

4. The apparatus of claim 3, wherein the delay introduced by the second delay circuit of each channel exceeds the delay introduced by the first delay circuit of the same channel by an amount at least as great as the reciprocal of the information bandwidth of the input signal.

5. The apparatus of claim 4, wherein the amount by which the delay introduced by the second delay circuit of each channel exceeds the delay introduced by the first delay circuit of the same channel is the same for all channels.

6. A signal detector comprising:

a band pass filter for receiving and filtering an input signal;

power dividing means for dividing the filtered signal received from said band pass filter into a plurality of pairs of divided signals each of equal power;

a plurality of delay means, connected to said power dividing means, each for introducing a delay into one signal of said pairs of divided signals;

a plurality of mixing means, each associated with and connected to a pair of said plurality of delay means for mixing together pairs of the plurality of divided signals delayed by said plurality of delay means to produce a mixed signal; and a low pass filter for filtering the mixed signal received from said mixing means.

7. An apparatus comprising:

a band pass filter for receiving and filtering an input signal;

power dividing means for dividing an input signal into a plurality of divided signals of equal power;

a plurality of delay means, connected to said power dividing means, each for introducing a delay into a corresponding one of said plurality of divided signals;

a plurality of mixing means, each associated with and connected to a pair of said plurality of delay means, for mixing together pairs of the plurality of divided signals delayed by said delay means;

voltage summing means for receiving and summing outputs of said plurality of mixing means; and a low pass filter for filtering the mixed signal received from said mixing means.

8. A method of enhancing the signal-to-noise ratio of an input signal comprising the steps of:

dividing an input signal into a plurality of divided signals of equal power;

introducing delays into said plurality of divided signals;

separately mixing each predetermined pair of the plurality of delayed divided signals; and summing the mixed signals to provide an output signal having an enhanced signal-to-noise ratio with respect to the input signal.

* * * * *